United States Patent [19]

Esselbrügge et al.

[11] Patent Number: 5,713,643
[45] Date of Patent: Feb. 3, 1998

[54] CONTROL CIRCUIT FOR AUTOMOTIVE VEHICLE MOTION CONTROL SYSTEMS

[75] Inventors: Hermann Esselbrügge, Weiterstadt; Bernhard Kant, Hochheim; Thomas Kranz, Rosbach, all of Germany

[73] Assignee: ITT Automotive Europe GmbH, Frankfurt, Germany

[21] Appl. No.: 596,155

[22] PCT Filed: Jul. 12, 1994

[86] PCT No.: PCT/EP94/02274

§ 371 Date: Feb. 12, 1996

§ 102(e) Date: Feb. 12, 1996

[87] PCT Pub. No.: WO95/04674

PCT Pub. Date: Feb. 16, 1995

[30] Foreign Application Priority Data

Aug. 11, 1993 [DE] Germany .................... 43 26 919.2

[51] Int. Cl.⁶ .................................................. B60T 8/78
[52] U.S. Cl. .................................................. 303/122.08
[58] Field of Search .............. 303/122.07, 122.08, 303/139, 174; 364/426.03

[56] References Cited

U.S. PATENT DOCUMENTS

| | | | |
|---|---|---|---|
| 4,113,321 | 9/1978 | Bleckmann | 303/92 |
| 4,360,918 | 11/1982 | Ruhnau | 303/122.07 |
| 4,546,437 | 10/1985 | Bleckmann et al. | |
| 4,916,698 | 4/1990 | McCann | 371/16.3 |
| 4,959,836 | 9/1990 | Berard | 371/69.1 |
| 4,995,042 | 2/1991 | Guthaus | 371/68.02 |
| 5,404,304 | 4/1995 | Wise | 303/122.08 |
| 5,411,324 | 5/1995 | Zydek et al. | |

FOREIGN PATENT DOCUMENTS

| | | |
|---|---|---|
| 0 357 922 | 3/1990 | European Pat. Off. |
| 2 757 911 | 6/1979 | Germany |
| 3 234 637 | 3/1984 | Germany |
| 3 831 193 | 3/1990 | Germany |
| 4 023 160 | 1/1991 | Germany |
| 3 925 829 | 2/1991 | Germany |
| 4 127 149 | 2/1992 | Germany |
| 4 106 704 | 9/1992 | Germany |
| 4 117 099 | 10/1992 | Germany |
| 4 137 124 | 5/1993 | Germany |
| 9 002 066 | 3/1990 | WIPO |
| 9 003 602 | 4/1990 | WIPO |

OTHER PUBLICATIONS

Stöcker, Von Ulrich; Bönisch, Günther, Zuverlässigkeit von elektronischen Bauteilen im Automobil, *ATZ Automobiltechnische Zeitschrift* 93 (1991), No. 7/8, Jul., Aug., Stuttgart, Germany.

English translation entitled Circuit Configuration for a Brake System with Anti–Lock Control and/or Traction Slip Control (labeled PCT7255) corresponding to DE 4137124, listed above.

German Search Report.
International Search Report.

*Primary Examiner*—Robert J. Oberleitner
*Assistant Examiner*—C. T. Bartz
*Attorney, Agent, or Firm*—Thomas N. Twomey; J. Gordon Lewis

[57] ABSTRACT

A control circuit for use with an automotive vehicle motion control system such as an anti-lock control (ABS) for an automotive vehicle brake system and/or traction slip control (TCS) includes circuits for processing sensor signals and for generating braking pressure control signals to enable hydraulic valves inserted into pressure fluid conduits of the brake system. The valve control signals are derived from the sensor signals by means of a single-chip microcontroller which processes the data in two successive or time-offset calculating operations performed according to different algorithms. The results of the calculating operations are temporarily stored and compared for coincidence. When the results differ from each other, their deviation is signaled to a monitoring circuit. In addition, the microcontroller is continuously tested by switch-on tests and, during operation, by cycle tests, self-tests, signature analyses and other known methods of error detection.

26 Claims, 4 Drawing Sheets

CONTROL CIRCUIT FOR AUTOMOTIVE VEHICLE MOTION CONTROL SYSTEMS

This application is the U.S. national-phase application of PCT International Application No. PCT/EP94/02274.

BACKGROUND OF THE INVENTION

The present invention relates to a control circuit for use with an automotive vehicle motion control system such as an anti-lock control (ABS) for an automotive vehicle brake system and/or traction slip control (TCS). Included in the present invention is a single-chip microcontroller for evaluating and processing data obtained by sensors and representative of the rotational behavior of the individual vehicle wheels, and for generating braking pressure control signals which are delivered to electrically commutable hydraulic valves inserted into the pressure fluid conduits of the brake system, and/or for generating engine torque control signals. The microcontroller is constantly checked on each activation, or as a function of other periodic events, and cyclically repeated during operation, by way of tests, self-tests, a signature analysis of the read-only memories and/or according to other per se known methods of error detection. The present invention also includes a monitoring circuit which deactivates or disconnects the control partially or entirely in the case of an interference.

A control circuit of this type is disclosed in European patent application No. 0 357 922. This publication describes a method of operating a service brake device for a commercial vehicle and an electronic control device for implementing the method. To evaluate and process the data obtained by sensors, a high-integration single-chip microcontroller is used which also comprises pulse-width modulators to generate the valve control signals. An integral component part of the microprocessor is a ROM-programmed test module performing a cyclically repeated self-test which includes all important functions and operations of the microcontroller. Further, the control device has a monitoring circuit which resets the microcontroller to an initialization condition in the case of defined malfunctions.

German patent No. 32 34 637 discloses a control circuit for an ABS system wherein the signals emitted by wheel sensors are processed in two independent, parallel, identically designed and identically programmed microcontrollers. The output signals of both microcontrollers are checked for coincidence. If there are differences, the control is deactivated or disconnected, thereby preserving the operability of the brake system, though without control. Thus, the known control circuit is based on a redundant signal processing in two complete circuits. The sole purpose of the redundancy is to reliably detect malfunctions and to disconnect the control upon malfunction. The disconnecting mechanisms also have a largely redundant design for the same reason.

There is no need for detailed explanations that the redundant signal processing by way of parallel operated, complete microcontrollers requires complicated structure.

In another known circuit arrangement of this type which is described in German patent application No. 41 37 124, the sensor signals or input signals are conducted in parallel to two circuits. Only one of the two circuits, however, performs the entire complicated signal processing operation. Monitoring is the main purpose of the second circuit. Therefore, the input signals are processed further after conditioning and forming of derivatives by way of simplified control algorithms and a simplified control philosophy. The simplified processing operation is sufficient to generate signals which permit concluding proper operation by comparison with the signals processed in the more sophisticated microcontroller.

The signal processing operation effected by this known circuit is also redundant to a large extent, though with restrictions. Apart from the sophisticated microcontroller for the actual signal processing, there is need for a second integrated circuit for the still complex, though simplified reproduction of the control algorithms.

SUMMARY OF THE INVENTION

A general object of the present invention is to still more reduce the necessary structure for the control circuit of the type initially referred to, without a loss in the reliability of the control and the safety of the error detection. Because it has previously been impossible to include all types of errors, a still greater increase in safety is an objective.

It has been found that this objective can be achieved by a control circuit of the type previously referred to. The special characteristic of the control circuit is that the single-chip microcontroller processes the data in at least two successive or time-offset calculating operations, which are performed at least in part according to different algorithms, and that the results and/or the intermediate results of the calculating operations are temporarily stored, compared and checked for coincidence, and that differences in the calculation results or the intermediate results are signaled to the monitoring circuit.

While, previously, the redundancy of signal processing (i.e. the so-called "passive" redundancy for a reliable disconnection in the case of an error) has been considered an absolutely necessary factor in a control circuit appropriate for brake systems, thus, requiting a control circuit structure with two parallel data-processing circuits, the present invention suggests obviating the need for this type of redundancy. Instead, two different calculating operations, which must come to the same result, are performed successively or time-offset in one single microcontroller. Subsequently, the results of both calculating operations are compared. In addition, the operability of the microcontroller is checked permanently by application of per se known methods of error detection.

A control circuit design according to the present invention permits reducing the circuit structure (i.e. only one microcontroller is required) and, nevertheless, achieving a degree of safety with respect to malfunctions which is comparable with the safety of known circuits, or even improved. When parallel actuated, identically programmed microcontrollers are used, it is possible that the same error occurs simultaneously in both circuits during operation. This may be due to mask errors, for example, which cause the same effect in two integrated circuits taken from the same batch. Such processor errors also are detected in data processing operations according to different algorithms.

Different, per se known methods of error detection, which are achieved by way of the software, are used to continuously check the entire microcontroller. Self-tests on each operation of the controller, tests of the read-only memories (ROM) during operation by way of a so-called signature analysis and checking the random access memories (RAM) by way of test samples for static and dynamic errors are some of the known methods applicable for the error detection.

In one embodiment of the present invention, the calculating operations, in which the input data are processed, are performed at least in part by access to values stored in tables.

For example, calculation results are compared with data taken from tables. Automatically, there are differences when data processing errors exist.

In another embodiment of the present invention, the microcontroller furnishes the monitoring circuit with an alternating signal, for example, a pulse train signal of a defined frequency and signal shape in the event of fail-free operation of the control circuit and due performance of the functions monitored by the microcontroller. In the absence of an error, the characteristic values of the alternating signal, for example, the frequency, pulse duration and pulse pauses, must be in the range of predetermined limit values.

It is also possible to use a numerical signal instead of the alternating signal to indicate to the monitoring circuit the fail-free operation of the microcontroller or the existence of errors.

Another method of error detection is to check the input signals of the microcontroller, the calculation results and/or the intermediate results for plausibility and to signal "hardly possible" signals, results or result combinations as errors to the monitoring circuit.

According to another preferred aspect of the present invention, the electric characteristic values of the hydraulic valves controlled by the microcontroller, the magnitude of the supply voltages for the hydraulic valves and for the electronic circuits, and the condition of the switches used to disconnect the control on malfunction are taken into account for the monitoring operations by the microcontroller or by the monitoring circuit. Further, the connecting lines and the electrical part of the hydraulic valves are, expediently, checked for line interruptions, short-circuits or leakage currents by the microcontroller and/or the monitoring circuit. Other components of the control circuit, such as clock generators, timers, etc., can also be included in the monitoring operations in a known fashion.

Further, it is appropriate to check the operability of the monitoring circuit by a switch-on or switch-off test and/or by test signals issued by the microcontroller. Thus, all circuits, even the test circuits themselves, are included in the tests.

According to still another preferred aspect of the present invention, the malfunctions are evaluated by the microcontroller and/or the monitoring circuit; and the control is deactivated or disconnected only if the duration of the malfunctions or the frequency per time unit exceeds predetermined tolerance thresholds. Typically, short-time malfunctions have no influence, or a negligible influence, on the braking effect. Relatively harmless errors or rarely occurring errors should be at least indicated. Errors of grave implication, which might jeopardize the braking function, cause disconnection of the control circuit. Also, the reaction to errors can be made a function of whether an ABS or a TCS control operation is performed, or whether there is no control operation at the moment considered.

Further features, advantages and possible applications of the present invention can be taken from the following description of embodiments with reference to the accompanying drawings.

DETAILED DESCRIPTION

Figure 1:
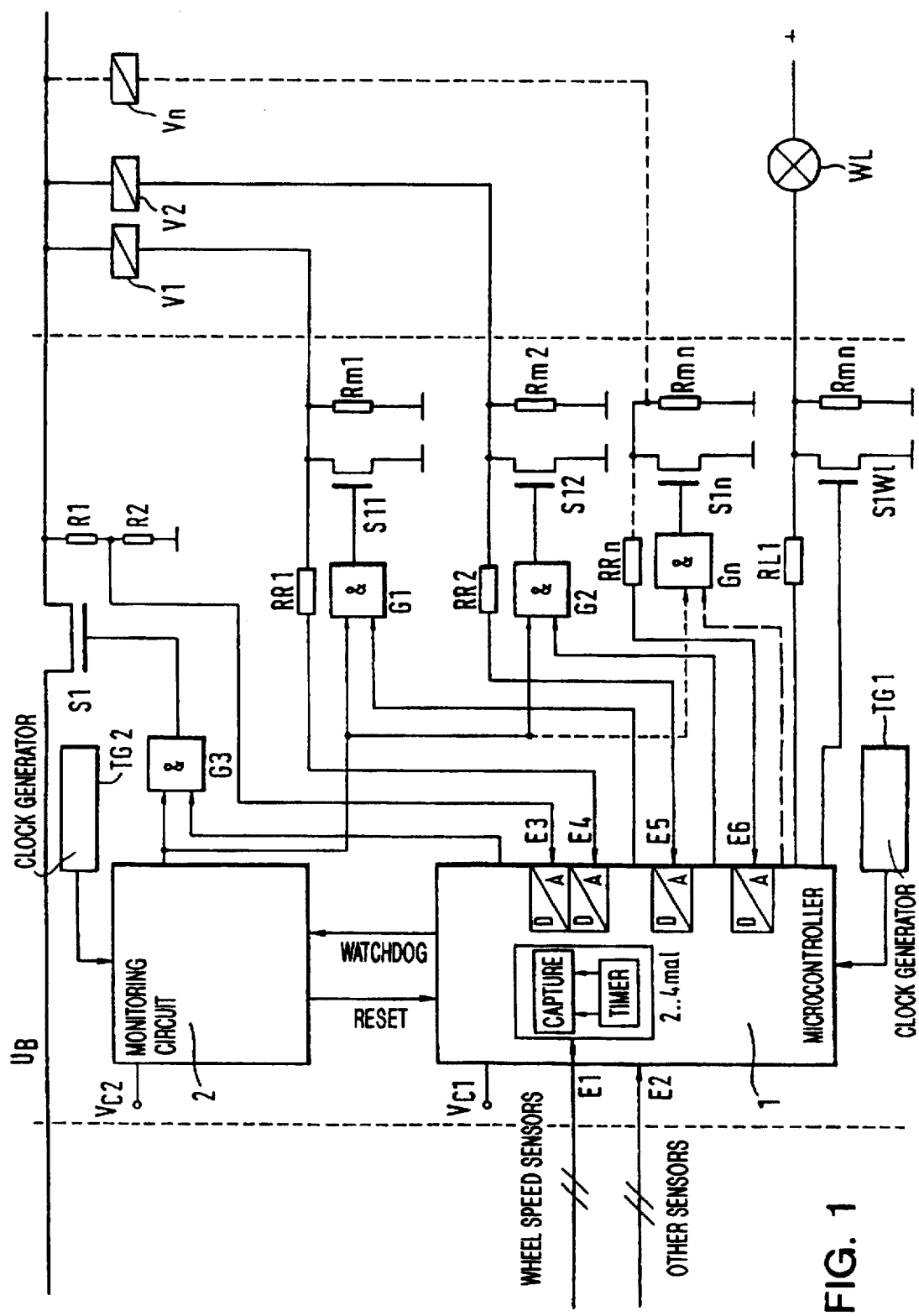
FIG. 1 is a block diagram view of the basic components of a control circuit in accordance with an exemplary embodiment of the present invention.

Components of a control circuit in accordance with an exemplary embodiment of the present invention, as shown in FIG. 1, include a single-chip microcontroller 1, a monitoring circuit 2, a semiconductor switch or a relay S1 to connect and disconnect the current supply for the valve coils V1, V2, Vn of hydraulic valves (not shown) and the semiconductor switches or transistors S11, S12, S1n to actuate the valve coils V1, V2, Vn. In the actuating path of the transistors S11, S12, S1n, there are AND gates G1, G2, Gn having two inputs each, by way of which the gates are connected to the microcontroller 1, on the one hand, and to the monitoring circuit 2, on the other hand. Also, in FIG. 1, there is an actuating transistor S1W1 for a warning lamp WL, clock generators TG1, TG2 to generate the operating cycles for the two integrated circuits, i.e., for the microcontroller 1 and the monitoring circuit 2. FIG. 1 also shows multiple lines which furnish the microcontroller, by way of the inputs E1, E2, with the wheel sensor signals (through E1) and further pieces of information (through E2) such as hydraulic valve operating status. Connections $V_{C1}$ and $V_{C2}$ serve for the voltage supply of the microcontroller 1 and the monitoring circuit 2, while the valves V1, V2, Vn are supplied with voltage from the battery $U_B$ by way of the semiconductor switch S1.

Further, an AND gate G3 is provided in the actuating path of the semiconductor switch S1 delivering an enable signal for the semiconductor switch S1 if both the monitoring circuit 2 and the microcontroller 1 determine a fail-free operation and issue a corresponding signal to actuate the switch S1 by way of the AND gate G3.

The middle connection of a voltage divider R1, R2 leads to an input E3 of the microcontroller 1. By way of this input, the microcontroller checks the existence and the magnitude of the voltage for the supply of the valve coils V1, V2, Vn. The switch condition of the valve actuating transistors S11, S12, S1n is signaled to the microcontroller 1 through the inputs E4, E5, E6. A line interruption, a short-circuit or an (increased) leakage current in the path to the valve coils V1, V2, Vn can be seen also by way of the inputs E4 to E6. Further monitoring operations can be achieved by logically combining the input signals and comparing them with the valve actuating signals.

The microcontroller 1 and the monitoring circuit 2 are interconnected by signal lines leading in both directions. Through line WD ("watch dog"), the microcontroller 1 issues to the monitoring circuit 2 an alternating signal or a numerical signal providing information about the fail-free operation and the fail-free condition of the microcontroller 1 and the functions monitored by the microcontroller. Some of the functions have been mentioned hereinabove. In addition, the monitoring circuit 2 may be checked for operability by a switch-on or switch-off test and/or by test signals issued by microcontroller 1; as disclosed in for example U.S. Pat. No. 5,411,324. The watch dog signal WG, or its frequency, pulse shape or numerical content, is within predetermined limit values only if malfunctions do not exist. Besides, it is possible to check the pieces of information and measured values, which are introduced through inputs E1, E2 and, above all, are representative of the rotational behavior of the individual wheels, for plausibility.

If the measured values or the combinations of measured values indicate states which are not "plausible" (because they are physically impossible, for example), there must be an error. The error is signaled to the monitoring circuit by the watch dog signal WG. Depending on the design of the monitoring system, an error causes immediate disconnection of the control, or the occurring error is "assessed" and causes different reactions in response to the result of the assessment. Some errors are tolerable for a short time, others involve a risk for the driving stability or the braking operation and, thus, require immediate disconnection of the control. A number of variants are possible with respect to the type of error and the reaction.

Figure 2:
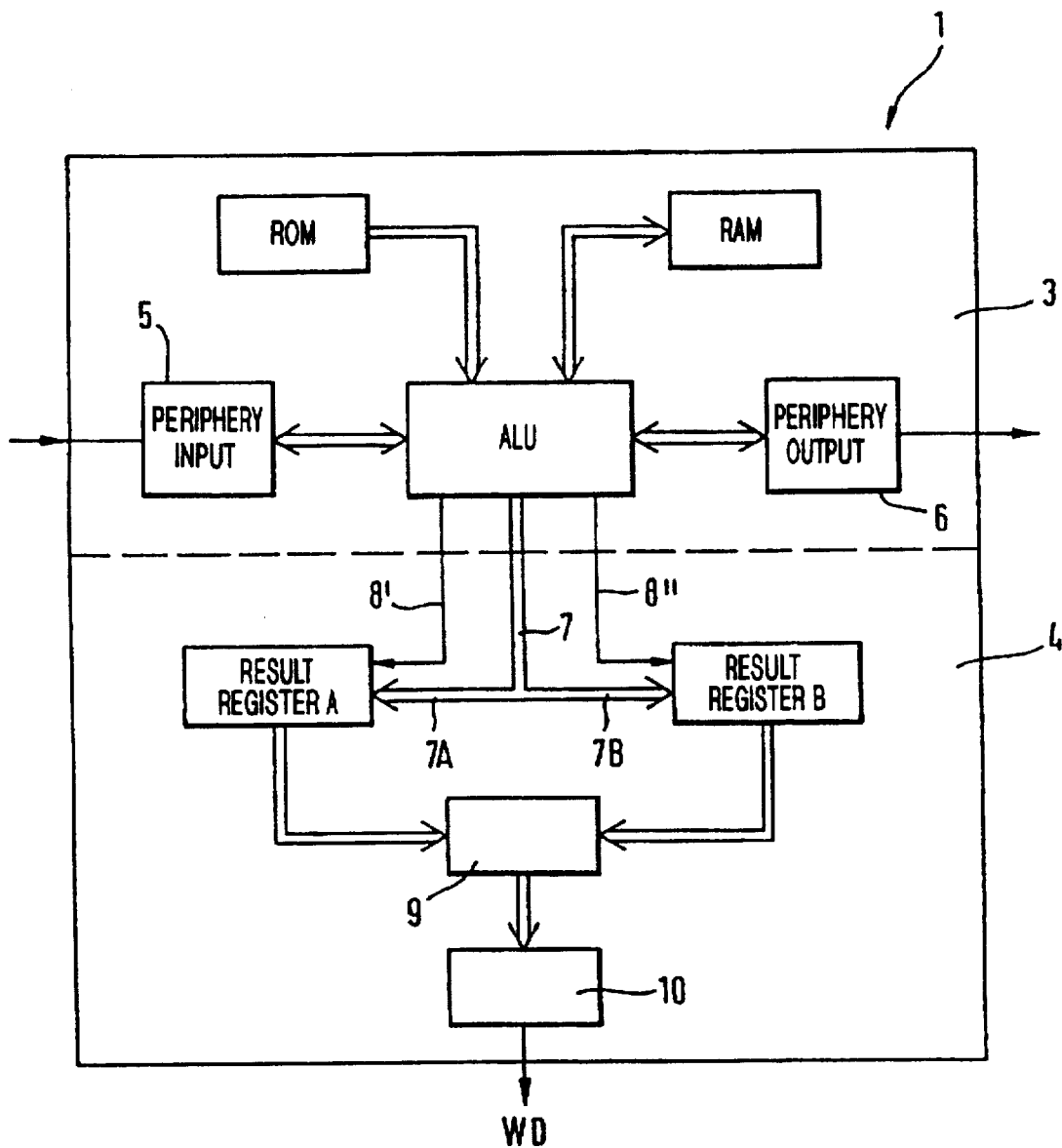
FIG. 2 is a view of further details of the microcontroller design of the control circuit in FIG. 1.

Another main feature of the control circuit according to the present invention is explained with regard to the exemplary embodiment of FIG. 2 in conjunction with the exemplary embodiment of FIG. 1. The individual, partly very complicated, calculating operations or algorithms, which include the so-called control philosophy and are required during anti-lock or traction slip control operations to generate the valve control signals as a function of the input signals, or to generate torque control signals; as disclosed (for example) in European Patent Application 0 434 059 are carried out in the microcontroller at least two times successively (or time-offset) according to the present invention. Different calculating methods or algorithms are chosen at least for part of the successive or time-offset calculating operations, which must achieve the same results or intermediate results. Table values can also be used for the calculating operations. The application of different calculating methods or algorithms for the same calculating operations causes non-coincidence of the results or the intermediate results when the microcontroller has structural defects or programming errors or has failed for other reasons.

The microcontroller 1 of the control circuit according to an exemplary embodiment of the present invention as illustrated by FIG. 2 comprises the actual main part 3 of the processor and additional circuits 4. The dotted horizontal line of separation represents this distinction. The main processor part includes the processor unit ALU, a read-only memory ROM and a random access memory RAM. Further, there are periphery input circuits 5 and periphery output circuits 6. The input signals are introduced and the output signals are emitted through these circuits, respectively. The above-mentioned units are interconnected by signal lines. The direction(s) of transmission of the signal lines is indicated by arrows in FIG. 2.

The microcontroller component with the additional circuits 4 includes the result registers A and B, which are essential for the present invention and record the results and/or the intermediate results of the successive or time-offset calculating operations. The signal lines or the data bus extending from the processor ALU of the main part 3 of the microcontroller to the result registers A, B are designated by reference numerals 7, 7A and 7B in FIG. 2. The memory commands are transmitted to the register A or B through lines 8', 8", respectively.

The contents of the registers A and B are supplied to a comparator 9 which detects a complete or incomplete coincidence of the compared signals, or differences between them. Finally, the output signal of the comparator is assessed in a unit 10. The assessed comparison result then determines the contents or the characterizing features of the watch dog signal WD which is delivered to the monitoring circuit 2, as shown in FIG. 1. Of course, the data and test results of the other testing operations, for example, introduced through the inputs E3 to E6 to the assessing unit 10 can be taken into account before generating the watch dog signal WG.

In the assessment of the comparison results, which can be effected by the unit 10 of the microcontroller 1 and/or in the monitoring circuit 2, the errors or differences are appropriately assessed for the control depending on the type, the duration or frequency, or the importance of the error. The result of this assessment determines whether the control is deactivated or disconnected, immediately or with delay, temporarily or permanently.

Figure 3:
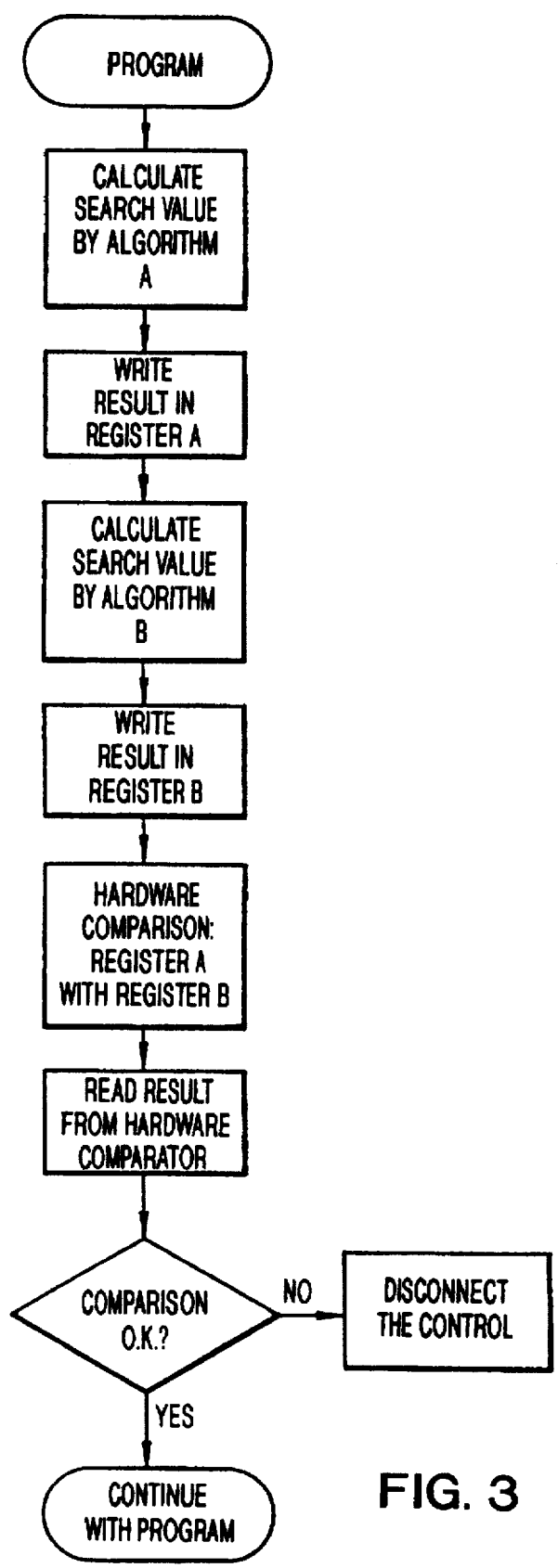
FIG. 3 is an exemplary flow chart of the check for coincidence of calculation results in the microcontroller of the control circuit of FIG. 1.

The flow chart in FIG. 3 shows in a simplified way the program part, which is important for the present invention and is carried out by way of the result registers A and B described in FIG. 2. The individual steps and commands are indicated in FIG. 3. In the absence of differences in the comparison, the calculating program will continue; otherwise, a command to disconnect the control is issued.

In addition, the application of known software methods for the detection of errors within the microcontroller increases the safety and reliability of the control circuit according to the present invention. Tests, self-tests, signature analyses, etc., of a known type are carried out on each connection or disconnection of the microcontroller or in dependence on other periodic events, in predetermined time intervals, etc., and cyclically repeating during operation. Information changes in the read-only memory (ROM), which are due to errors, can be detected by checking the contents of the read-only memory by way of the known signature analysis. The flow chart of FIG. 3 relates to this method. In random access memories (RAM), static and dynamic errors in addressing, storing and reading can be detected by known checking methods using test samples. For example, an inverse element is entered in a memory with uniform values, and, subsequently, all other elements are checked for a correct content. After each reading operation in one of the cells, the test cell is checked. This action is repeated for all elements. A second test run is performed with the inverse memory space allocation of the entire memory.

Figure 4:
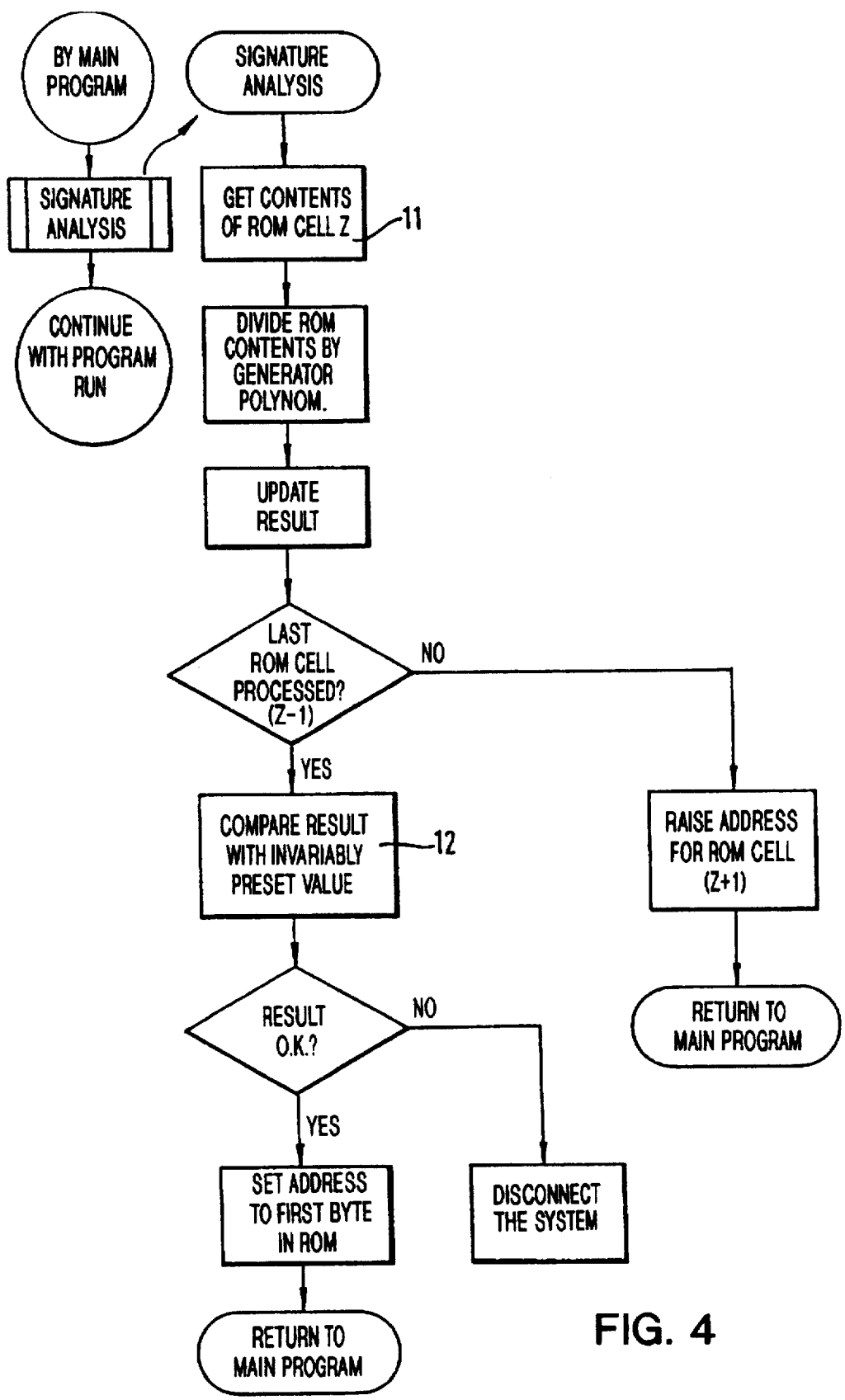
FIG. 4 is an exemplary flow chart of an error detection operation by a cyclic signature analysis.

The flow chart in FIG. 4 shows the individual steps of the cyclically repeated signature analysis for checking a read-only memory. The main program starts the signature analysis at determined times when admitted by the program run. The individual program steps, their order and the decision points are shown in FIG. 4. The illustrated cycle of command 11 ("get contents of the ROM cell for checking") to command 13 ("return to the main program") is successively repeated for all ROM cells. For the error detection, the result is compared with a predetermined programmed value in program step 12.

The operation of the timers, their time behavior, the correct formation of increment or decrement, etc., is checked by other cycle tests.

Finally, the results of all tests are recorded in the watch dog signal WD and transmitted to the monitoring circuit 2.

Thus, a control circuit is provided on the basis of one single microcontroller in conjunction with a monitoring circuit, according to the present invention. The immediate detection and signaling of errors of different types is ensured by data processing, which is essential to the present invention, i.e. by successive or time-offset calculating operations according to different algorithms in conjunction with periodic and cyclically repeated tests.

We claim:

1. A control circuit for use in automotive vehicle brake systems with at least one of (a) anti-lock control (ABS) and (b) traction slip control (TCS), including a microcontroller for evaluating and processing data obtained by sensors and representative of the rotational behavior of the individual vehicle wheels, and for at least one of (a) generating braking pressure control signals which are delivered to electrically commutable hydraulic valves inserted into the pressure fluid conduits of the brake system, and (b) generating engine torque control signals, wherein the microcontroller is constantly checked on each activation, or as a function of other periodic events, by way of tests, self-tests, or a signature analysis of the read-only memories and including a monitoring circuit which deactivates or disconnects the control partially or entirely in the case of an interference, characterized in that the single-chip microcontroller processes the data in at least two successive or time-offset calculating operations, which are performed at least in part according to different algorithms, in that at least one of the results and the intermediate results of the calculating operations are temporarily stored, compared and checked for coincidence, and in that differences in the calculation results or the intermediate results are signaled to the monitoring circuit.

2. A control circuit as claimed in claim 1, characterized in that the calculating operations are performed at least in part by using values stored in tables.

3. A control circuit as claimed in claim 1, characterized in that the microcontroller delivers an alternating signal of a defined frequency and signal shape to the monitoring circuit in fail-free operation of the control circuit and due performance of the functions monitored by the microcontroller.

4. A control circuit as claimed in claim 3, characterized in that the alternating signal is a pulse train signal, and the pulse times and times of pulse pause of the signal are within the range of predetermined limit values, with proper function of the control circuit.

5. A control circuit as claimed in claim 1, characterized in that the microcontroller issues numerical signals to the monitoring circuit to indicate the fail-free operation of the control circuit and the functions monitored by the microcontroller.

6. A control circuit as claimed in claims 1, characterized in that the input signals of the microcontroller, the calculation results or the intermediate results are checked for plausibility, and in that the occurrence of non-expected signals, results or result combinations is rated as an error and signaled to the monitoring circuit.

7. A control circuit as claimed in claim 1, characterized in that the state and the function of the hydraulic valves actuated by the microcontroller, the magnitude of the supply voltages for the hydraulic valves and for the electronic circuits, and the condition of one or more of the switches used to disconnect the control is taken into account for the monitoring operation by the microcontroller.

8. A control circuit as claimed in claim 1, characterized in that the connecting lines and the electrical part of the hydraulic valves are checked for line interruptions, short-circuits or leakage currents by the microcontroller and/or the monitoring circuit.

9. A control circuit as claimed in claim 1, characterized in that the monitoring circuit is checked for operability by at least one of (a) a switch-on or switch-off test and (b) test signals issued by the microcontroller.

10. A control circuit as claimed in claim 1, characterized in that the microcontroller and the monitoring circuit evaluates the malfunctions and deactivates or disconnects the control if the duration of the malfunctions or the frequency of the malfunctions per time unit exceeds predetermined tolerance thresholds.

11. A control circuit as claimed in claim 1, characterized in that the microcontroller and the monitoring circuit evaluates the malfunctions and disconnects the control if a malfunction occurs which jeopardizes the braking effect.

12. A control circuit for use with an automotive vehicle motion control system, comprising:
  receiving means for receiving signals which indicate rotational behavior of at least one wheel;
  processing means for processing said received signals using two separate and at least partially different algorithms which are expected to generate corresponding results;
  storage means for storing at least one of results and temporary results generated by said two algorithms;
  comparing means for comparing said stored one of results and temporary results; and
  signaling means for signaling the motion control system if said comparison indicates a difference.

13. A control circuit according to claim 12, wherein said processing means is a single chip microcontroller which generates at least one of:
  (a) braking pressure control signals which are delivered to electrically commutable hydraulic valves inserted into pressure fluids conduits of a brake system; and
  (b) engine torque control signals.

14. A control circuit according to claim 12, wherein said processing means is checked on one of (a) activation, and (b) a function of periodic events, by way of at least one of test, self-test, signature analysis, and error detection.

15. A control circuit according to claim 12, wherein said processing means processes said received signals in at least one of successive and time-offset calculating operations.

16. A control circuit according to claim 12, wherein said processing means processes said received signals using values stored in tables.

17. A control circuit according to claim 12, wherein an alternating signal of defined frequency and signal shape is generated by said comparing means if there is fail-free operation of said processing means.

18. A control circuit according to claim 17, wherein said alternating signal is a pulse train signal within a predetermined range of attributes if the control circuit is operating properly.

19. A control circuit according to claim 12, wherein the control circuit generates numerical signals to indicate fail-free operation of said processing means.

20. A control circuit according to claim 12, wherein said one of results and temporary results are checked for plausibility and wherein improper results or temporary results are determined to be an error.

21. A control circuit according to claim 12, wherein the automotive vehicle motion control system includes hydraulic valves which are actuated by said processing means and wherein function of said hydraulic valves and a supply voltage for said hydraulic valves is monitored by said processing means to determine whether a signal should be generated to suspend control by the automotive vehicle motion control system.

22. A control circuit according to claim 21, wherein at least one of connecting lines and electrical components of said hydraulic valves are checked for at least one of line interruptions, short circuits, and leakage currents by said processing means.

23. A control circuit according to claim 12, wherein said comparison means signals a monitoring circuit if said comparison indicates a difference, and said control circuit further comprises means for checking operability of said monitoring circuit by one of a switch-on/switch-off test and test signals generated by said processing means.

24. A control circuit according to claim 12, further comprising:

(a) a monitoring circuit for being signaled by said signaling means as said comparison indicates a difference, and (b) means for evaluating malfunctions in at least one of said processing means and said monitoring circuit and for deactivating or disconnecting control of the control circuit if duration of malfunctions or frequency of malfunctions per time unit exceeds predetermined tolerance thresholds.

25. A control circuit according to claim 24, wherein at least one of said processing means and said monitoring circuit evaluates malfunctions and disconnects control of the automotive vehicle motion control system if a malfunction occurs which jeopardizes expected braking effects.

26. A method of controlling an automotive vehicle motion control system comprising the steps of:

(a) receiving signals which indicate rotational behavior of at least one wheel;

(b) processing said received signals using two separate and, at least, partially different algorithms which are expected to generate corresponding results;

(c) storing at least one of results and temporary results generated by said two algorithms in separate storage locations;

(d) comparing said stored one of results and temporary results; and (e) signaling the motion control system if said comparison indicates a difference.

* * * * *